(12) United States Patent
Mundt

(10) Patent No.: US 8,144,119 B2
(45) Date of Patent: Mar. 27, 2012

(54) METHOD AND APPARATUS FOR COUPLING A DISPLAY TO AN INFORMATION HANDLING SYSTEM

(75) Inventor: Kevin Mundt, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 1307 days.

(21) Appl. No.: 11/392,161

(22) Filed: Mar. 29, 2006

(65) Prior Publication Data
US 2007/0236458 A1     Oct. 11, 2007

(51) Int. Cl.
*G09G 5/00* (2006.01)
(52) U.S. Cl. .............. 345/156; 345/905; 439/43
(58) Field of Classification Search ............ 439/43, 439/62, 83, 638; 345/167, 156, 905; 349/150; 361/681, 749
See application file for complete search history.

(56) References Cited

U.S. PATENT DOCUMENTS

| | | | | |
|---|---|---|---|---|
| 4,836,651 A | * | 6/1989 | Anderson | 349/150 |
| 5,168,384 A | * | 12/1992 | Genba | 349/58 |
| 5,598,627 A | * | 2/1997 | Saka et al. | 29/861 |
| 5,865,650 A | * | 2/1999 | Marian et al. | 439/638 |
| 6,181,404 B1 | * | 1/2001 | Gaffney | 349/149 |
| 6,280,206 B1 | * | 8/2001 | Kuroda et al. | 439/83 |
| 6,522,372 B2 | | 2/2003 | Yang | |
| 7,083,423 B1 | * | 8/2006 | Guerra et al. | 439/62 |
| 2002/0149914 A1 | * | 10/2002 | Karasawa et al. | 361/749 |

* cited by examiner

*Primary Examiner* — Chanh Nguyen
*Assistant Examiner* — Tsegaye Seyoum
(74) *Attorney, Agent, or Firm* — Haynes and Boone, LLP

(57) ABSTRACT

A display coupling apparatus includes a first circuit board having a display connector end. A first cable coupling pad is located on the first circuit board. At least one trace on the first circuit board extends from the display connector end to the first cable coupling pad. The display coupling apparatus is used to electrically couple a display to an information handling system.

21 Claims, 12 Drawing Sheets

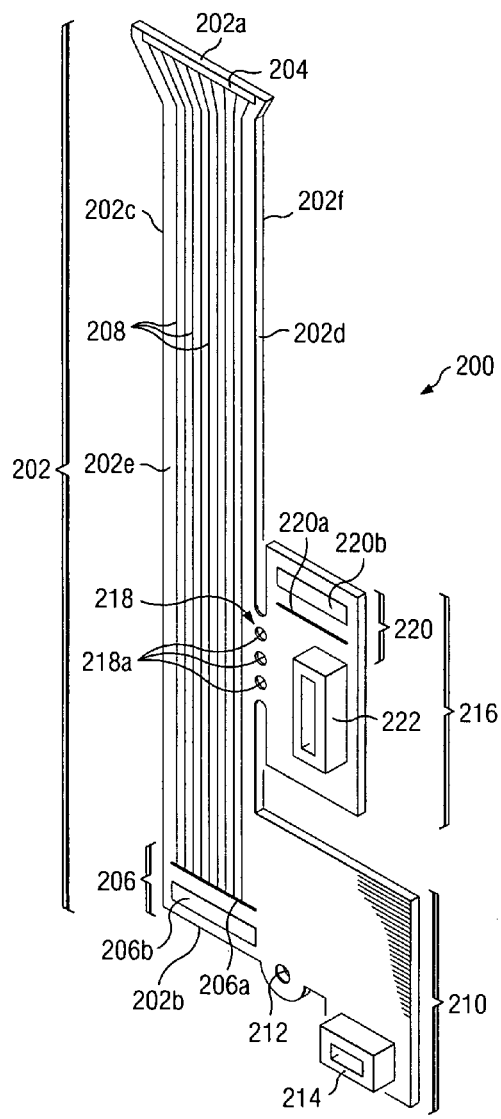
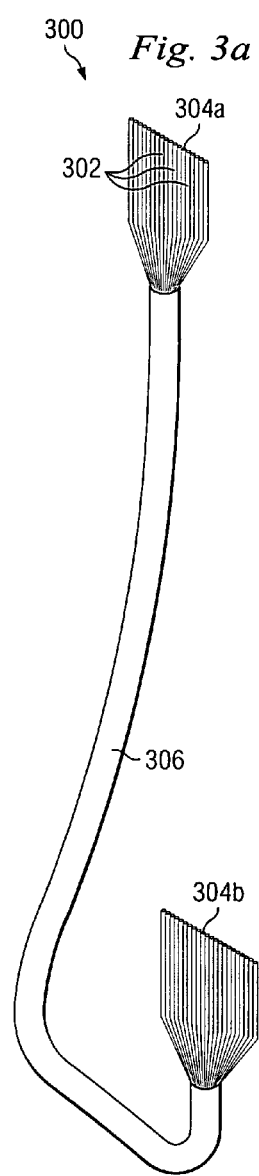

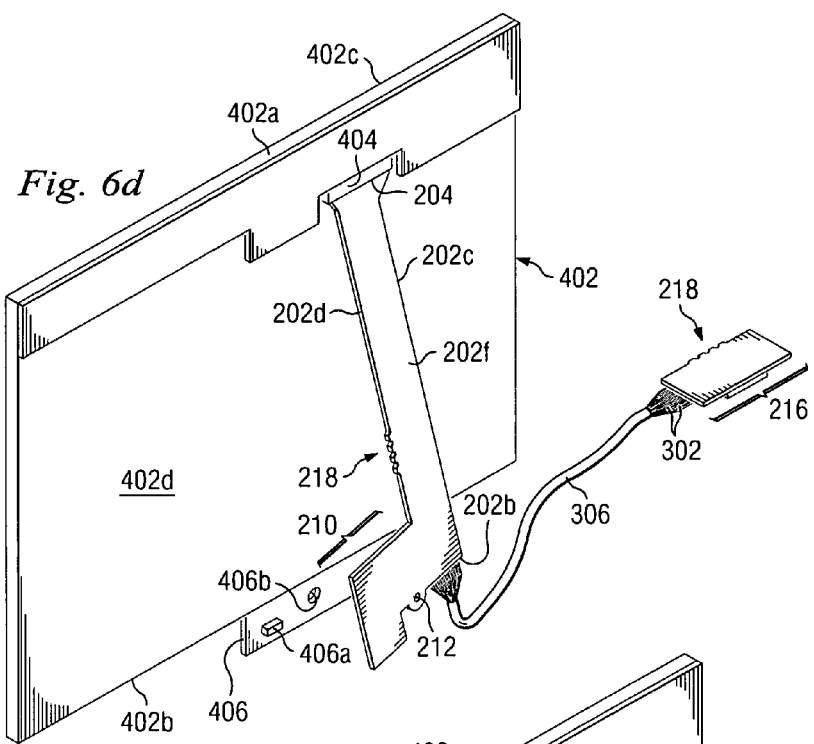
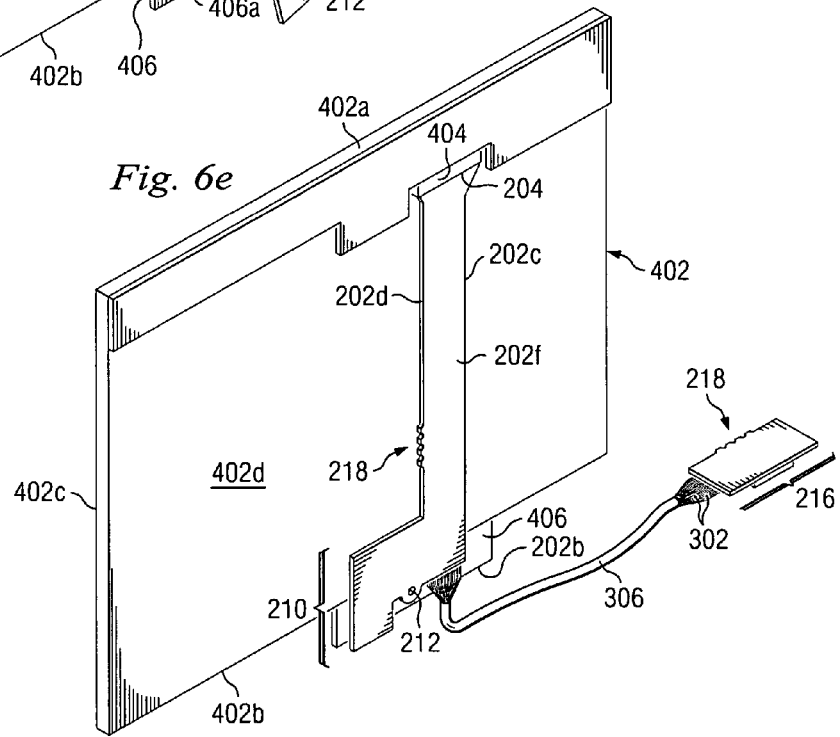

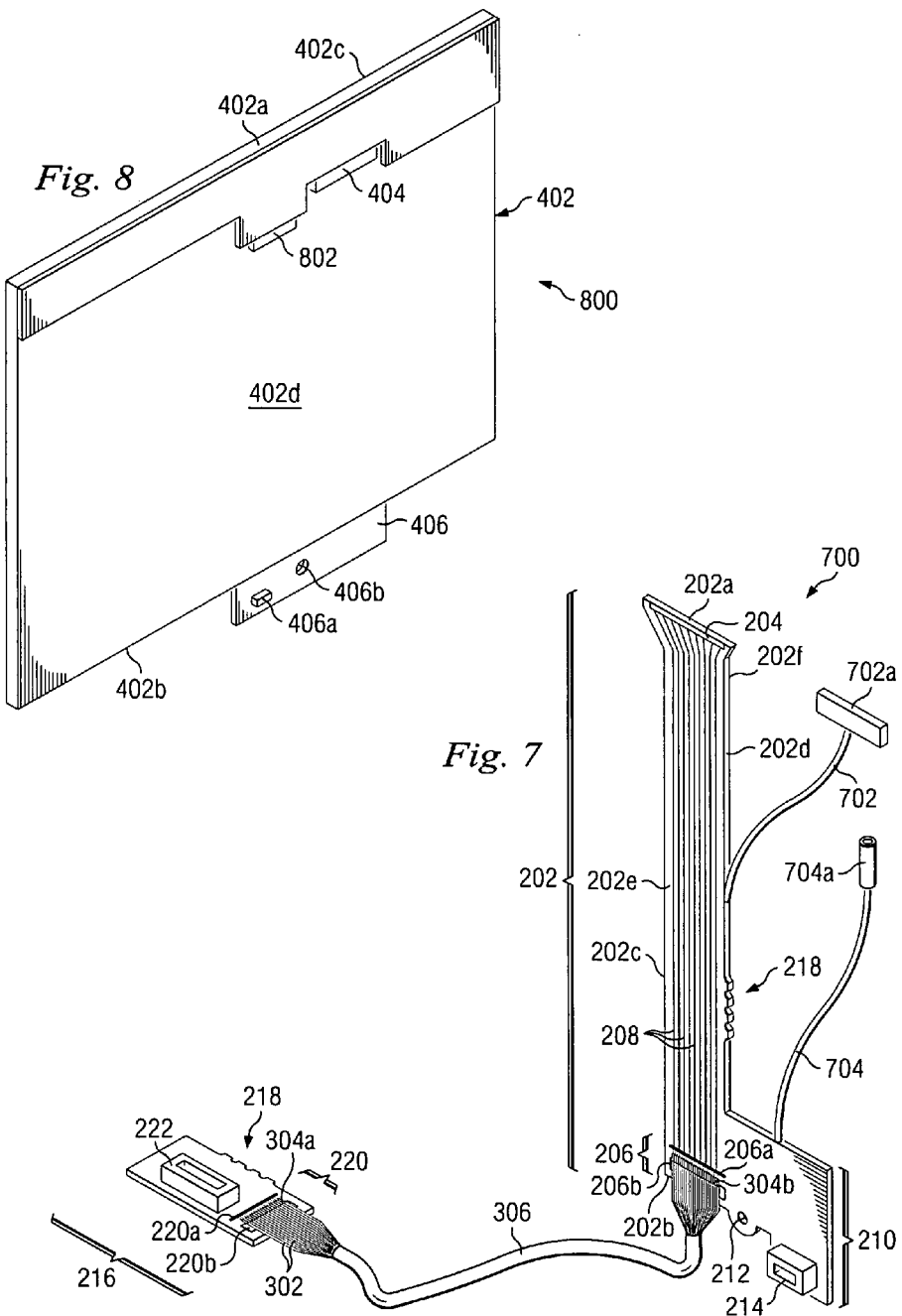

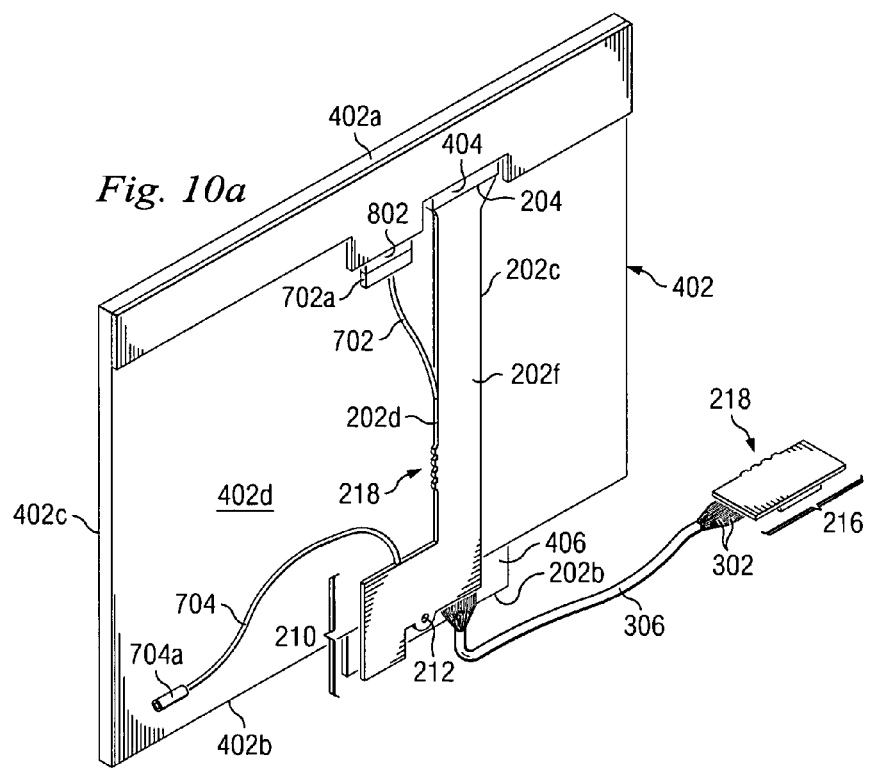

METHOD AND APPARATUS FOR COUPLING A DISPLAY TO AN INFORMATION HANDLING SYSTEM

BACKGROUND

The present disclosure relates generally to information handling systems, and more particularly to coupling a display to an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems such as, for example, notebook computers, include a display such as, for example, a liquid crystal display (LCD), which is electrically coupled to the information handling system. The coupling of the display to the information handling system raises a number of issues.

The display is typically coupled to the information handling system using a cable assembly. These cable assemblies include small gauge wires such as, for example, twin-axial coaxial wires, which require a microscope or some other form of magnification to sort the two internal leads of the wire and conductive shielding tape to protect against electromagnetic interference. In some situations, eighteen wire pairs must be sorted and soldered to terminate the twin-axial coaxial wires to a connector, resulting in a relatively highly labor intensive process. The use of the small gauge wires results in a relatively high voltage drop over the length of the wires, which degrades signals sent between the information handling system and the display. Furthermore, the wires are typically terminated to low-volume, high-cost connectors that are more expensive and difficult to assemble relative to commodity connectors.

Such conventional methods and apparatus for coupling a display to an information handling system result in a cable assembly that requires a manual and difficult to repeat assembly process that includes higher than desired parts costs, labor costs, and failure rates.

Accordingly, it would be desirable to provide for coupling a display to an information handling system absent the disadvantages found in the prior devices discussed above.

SUMMARY

According to one embodiment, a display coupling apparatus includes a first circuit board comprising a display connector end, a first cable coupling pad located on the first circuit board, and at least one trace on the first circuit board extending from the display connector end to the first cable coupling pad.

BRIEF DESCRIPTION OF THE DRAWINGS

FIG. 2 is a perspective view illustrating an embodiment of a circuit board.

FIG. 3a is a perspective view illustrating an embodiment of an information handling system connecting cable used with the circuit board of FIG. 2.

FIG. 3b is a side view illustrating an embodiment of the information handling system connecting cable of FIG. 3a.

FIG. 4 is a perspective view illustrating an embodiment of a display used with the circuit board of FIG. 2 and the information handling system connecting cable of FIG. 3a.

FIG. 6d is a perspective view illustrating an embodiment of the display coupling apparatus of FIG. 6c being coupling to the display of FIG. 4.

FIG. 6e is a perspective view illustrating an embodiment of the display coupling apparatus of FIG. 6c coupling to the display of FIG. 4.

FIG. 7 is a perspective view illustrating an embodiment of a display coupling apparatus.

FIG. 8 is a perspective view illustrating an embodiment of a display used with the display coupling apparatus of FIG. 7.

FIG. 10a is a perspective view illustrating an embodiment of the display coupling apparatus of FIG. 7 coupling to the display of FIG. 8.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

Figure 1:
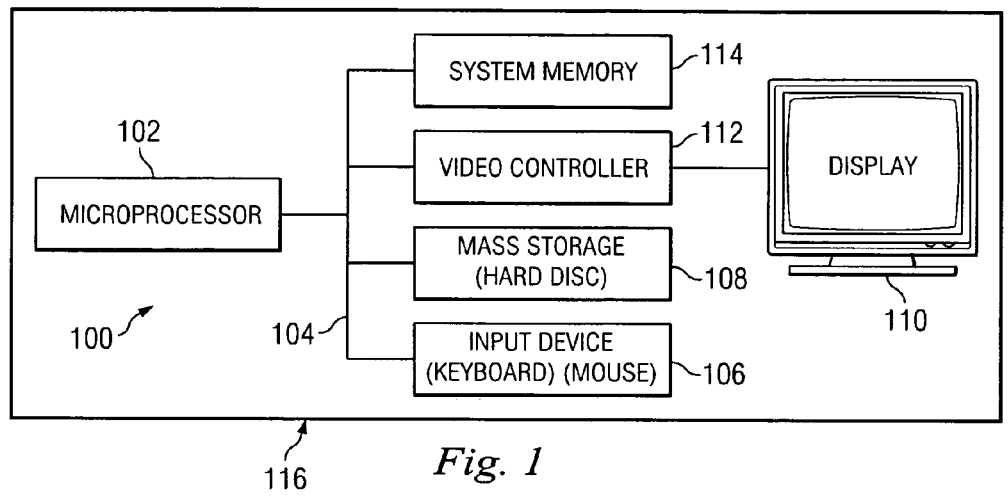
FIG. 1 is a schematic view illustrating an embodiment of an information handling system.

In one embodiment, information handling system 100, FIG. 1, includes a microprocessor 102, which is connected to a bus 104. Bus 104 serves as a connection between microprocessor 102 and other components of computer system 100. An input device 106 is coupled to microprocessor 102 to provide input to microprocessor 102. Examples of input devices include keyboards, touchscreens, and pointing devices such as mouses, trackballs and trackpads. Programs and data are stored on a mass storage device 108, which is coupled to microprocessor 102. Mass storage devices include such devices as hard disks, optical disks, magneto-optical drives, floppy drives and the like. Information handling system 100 further includes a display 110, which is coupled to microprocessor 102 by a video controller 112. A system memory 114 is coupled to microprocessor 102 to provide the microprocessor with fast storage to facilitate execution of computer programs by microprocessor 102. In an embodiment, a chassis 116 houses some or all of the components of information handling system 100. It should be understood that other buses and intermediate circuits can be deployed between the components described above and microprocessor 102 to facilitate interconnection between the components and the microprocessor.

Referring now to FIG. 2, a circuit board 200 is illustrated. The circuit board 200 includes an elongated first circuit board 202 having a top edge 202a, a bottom edge 202b located opposite the top edge 202a, a pair of opposing side edges 202c and 202d extending between the top edge 202a and the bottom edge 202b, a top surface 202e extending between the top edge 202a, the bottom edge 202b, and the side edges 202c and 202d, and a bottom surface 202f located opposite the top surface 202d and extending between the top edge 202a, the bottom edge 202b, and the side edges 202c and 202d. A display connector end 204 is located on the top edge 202a of the first circuit board 202. A first cable coupling pad 206 is located on the top surface 202e of the first circuit board 202 adjacent the bottom edge 202b and includes a conductor pad 206a and a ground pad 206b. A plurality of traces 208 extend along length of the first circuit board 202 from the display connector end 204 to the first cable coupling pad 206, electrically coupling the display connector end 204 to the first cable coupling pad 206. In an embodiment, the display connector end 204 may include a connector such as, for example, a connector specified by the Video Electronics Standards Association (VESA) which is operable to couple to a connector on a liquid crystal display (LCD), also specified by VESA. In an embodiment, the display connector end 204 may be designed to coupled directly to a LCD connector specified by VESA by, for example, using a 0.5mm circuit board which may be plated at the display connector end 204 and is operable to engage an a LCD connector specified by VESA. In an embodiment, the first circuit board 202 of the circuit board 200 may include a four-layer printed circuit board (PCB) to provide for electromagnetic interference (EMI) shielding for the traces 208.

A coupling section 210 of the first circuit board 202 extends from side surface 202d of the first circuit board 202 adjacent the bottom edge 202b of the first circuit board 202 and shares the top surface 202e and the bottom surface 202f of the first circuit board 202. The coupling section 210 defines a grounding aperture 212 which extends through the coupling section 210 from the top surface 202e to the bottom surface 202f. An inverter board connector 214 is coupled to the top surface 202e of the coupling section 210 and located adjacent the grounding aperture 212. In an embodiment, the inverter board connector 214 is a commodity surface mount technology connector known in the art. A second circuit board 216 extends from the side edge 202d of the first circuit board 202 and shares the top surface 202e and the bottom surface 202f of the first circuit board 202. The second circuit board 216 extends from the first circuit board 202 on a break-away coupling 218 that defines a plurality of break-away apertures 218a extending through the break-away coupling 218 from the top surface 202e to the bottom surface 202f. A second cable coupling pad 220 is located on the top surface 202e of the second circuit board 216 and includes a conductor pad 220a and a ground pad 220b. An information handling system connector 222 is coupled to the top surface 202e of the second circuit board 216 and located adjacent the second cable coupling pad 220. In an embodiment, the information handling system connector 222 is a commodity surface mount technology connector known in the art. In an embodiment, the first circuit board 202 and the second circuit board 216 are fabricated such that they are coupled together by the break-away coupling 218 in order to allow the first circuit board 202 and the second circuit board 216 of circuit board 200 to be populated as a single assembly with components such as, for example, the traces 208, the first cable coupling pad 206, the second cable coupling pad 220, the inverter board connector 214, the information handling system connector 222, and a variety of other components known in the art. In an embodiment, the circuit board 200 may include a variety of active components known in the art to provide a variety of functions known in the art such as, for example, emissions control. In an embodiment, the circuit board 200 may include identifier printing on the first circuit board 202 and/or the second circuit board 216 which replaces labels that are used on conventional cable assemblies for coupling a display to an information handling system.

Figure 3B:
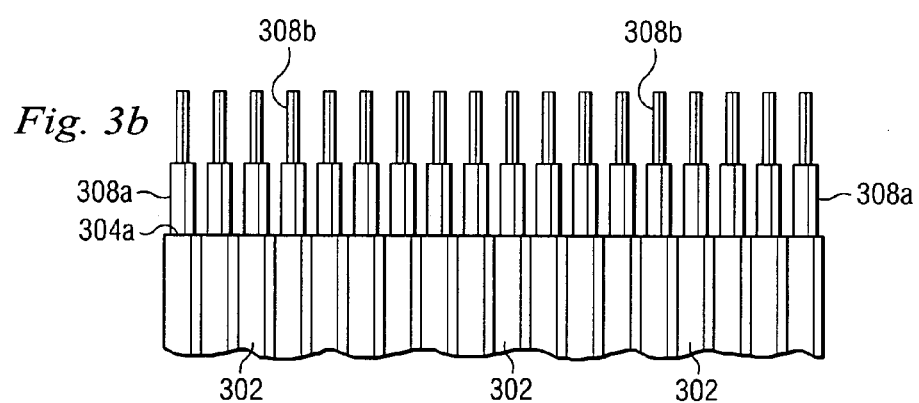

Referring now to FIGS. 3a and 3b, an information handling system connecting cable 300 is illustrated. The information handling system connecting cable 300 includes a plurality of cables 302 which have been ribbonized and includes a pair of opposing ends 304a and 304b. A wrap 306 is provided between the ends 304a and 304b of the plurality of ribbonized cables 302 in order to order to bundle the cables 302 together to allow the cables 302 routed. In an embodiment, the plurality of cables 302 are micro-coaxial cables, the end 304a which may be stripped using, for example, a laser wire stripper, in order to allow a braided outer conductor 308a and a center conductor 308b to extend from the end 304a, illustrated in FIG. 3b. The end 304b of the cables 302 may be stripped in the same manner as described above for end 304a. The use of micro-coaxial cables as the cables 302 provides an information handling system connecting cable in which the cable leads do not have to be sorted, reducing labor costs and assembly times relative to a conventional cable assembly for coupling a display to an information handling system.

Figure 4:
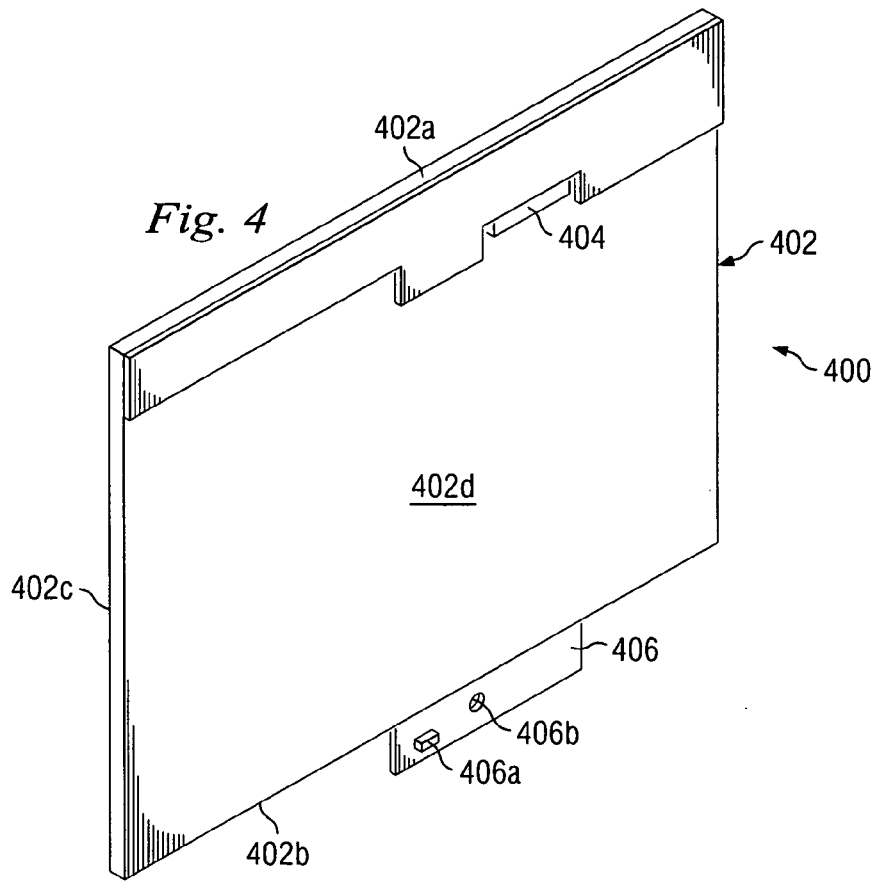

Referring now to FIG. 4, a display 400 is illustrated. The display 400 includes a base 402 having a top edge 402a, a bottom edge 402b located opposite the top edge 402a, a front surface 402c extending between the top edge 402a and the bottom edge 402b, and a rear surface 402d located opposite the front surface 402c and extending between the top edge 402a and the bottom edge 402b. A display connector 404 is located on the display 400 adjacent the rear surface 402d and the top edge 402a. In an embodiment, the display connector 404 is a connector which is specified by VESA for displays. An inverter board connecting section 406 extends from bottom edge 402b of the base 402, includes an inverter board connector 406a which is electrically coupled to an inverter board (not shown), and defines a securing aperture 406b located adjacent the inverter board connector 406a. In an embodiment, the display 400 is an LCD, and the display connector 404 is a connector specified by VESA for LCD displays.

Figure 5:
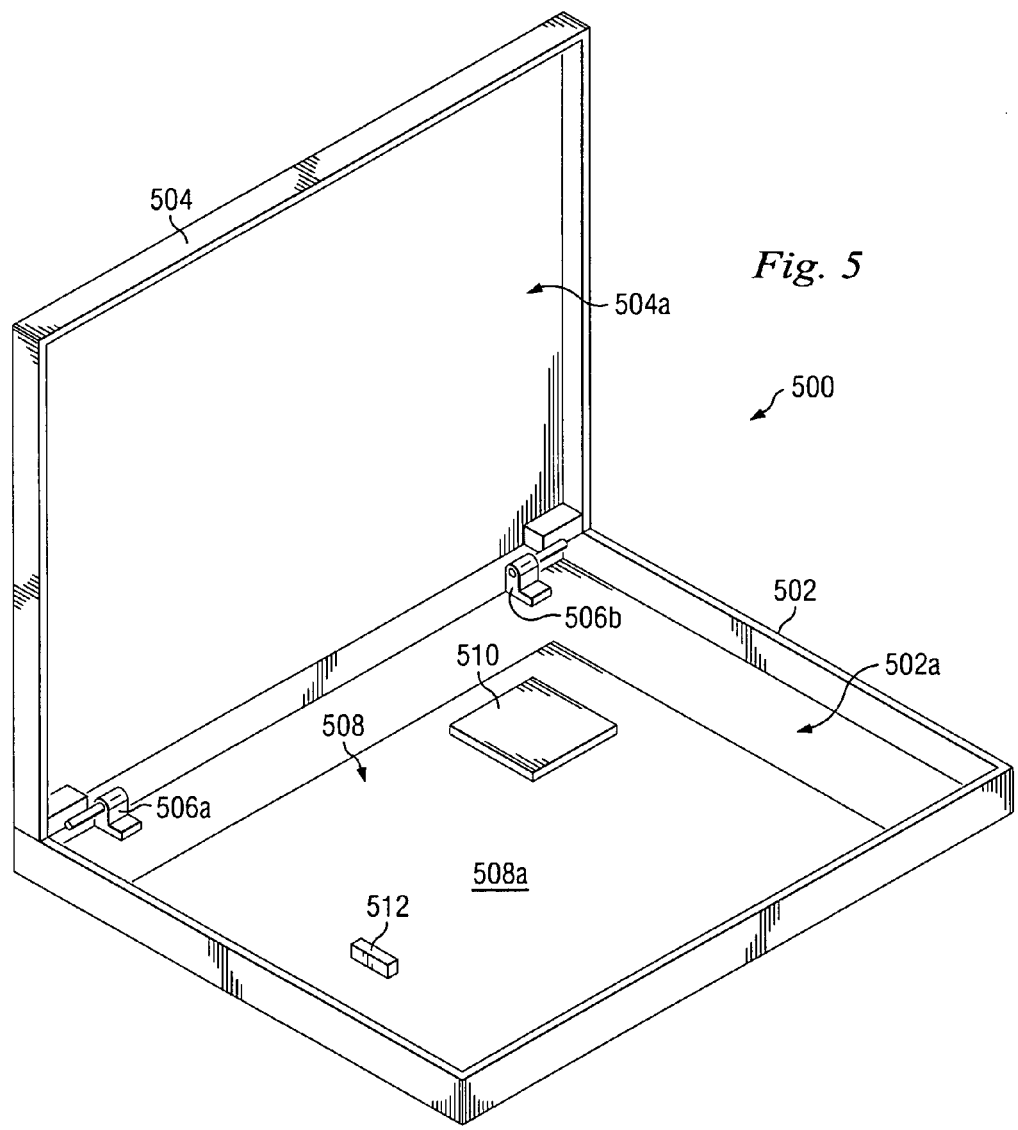
FIG. 5 is a perspective view illustrating an embodiment of a chassis used with the circuit board of FIG. 2, the information handling system connecting cable of FIG. 3a, and the display of FIG. 4.

Referring now to FIG. 5, a chassis 500 is illustrated. In an embodiment, the chassis 500 is the chassis 116, described above with reference to FIG. 1, and houses some or all of the components of an information handling system such as, for example, the information handling system 100, described above with reference to FIG. 1. The chassis 500 includes a base section 502 which defines a board housing 502a. A display section 504 defines a display channel 504a and is pivotally coupled to the base section 502 by a plurality of pivotal couplers 506a and 506b. A board 508 includes a top surface 508a and is located in the board housing 502a defined by the base section 502. A microprocessor 510 which may be, for example, the microprocessor 102, described above with respect to FIG. 1, is coupled to the board 508 and located on the top surface 508a of the board 508. A microprocessor coupler 512 is located on the top surface 508a of the board 508 and is electrically coupled to the microprocessor 510.

Figure 6A:
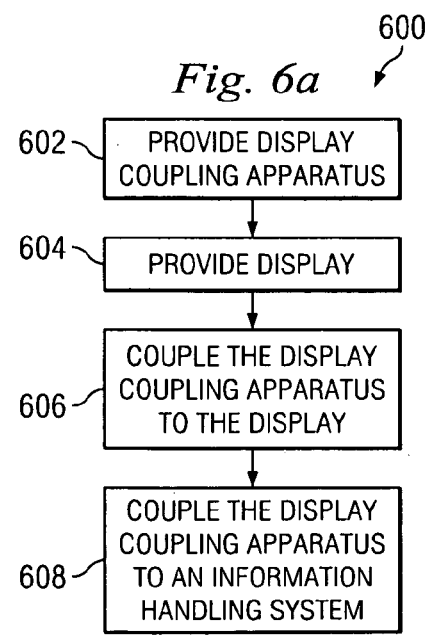
FIG. 6a is a flow chart illustrating an embodiment of a method for coupling a display to an information handling system.
Figures 6B, 6C:
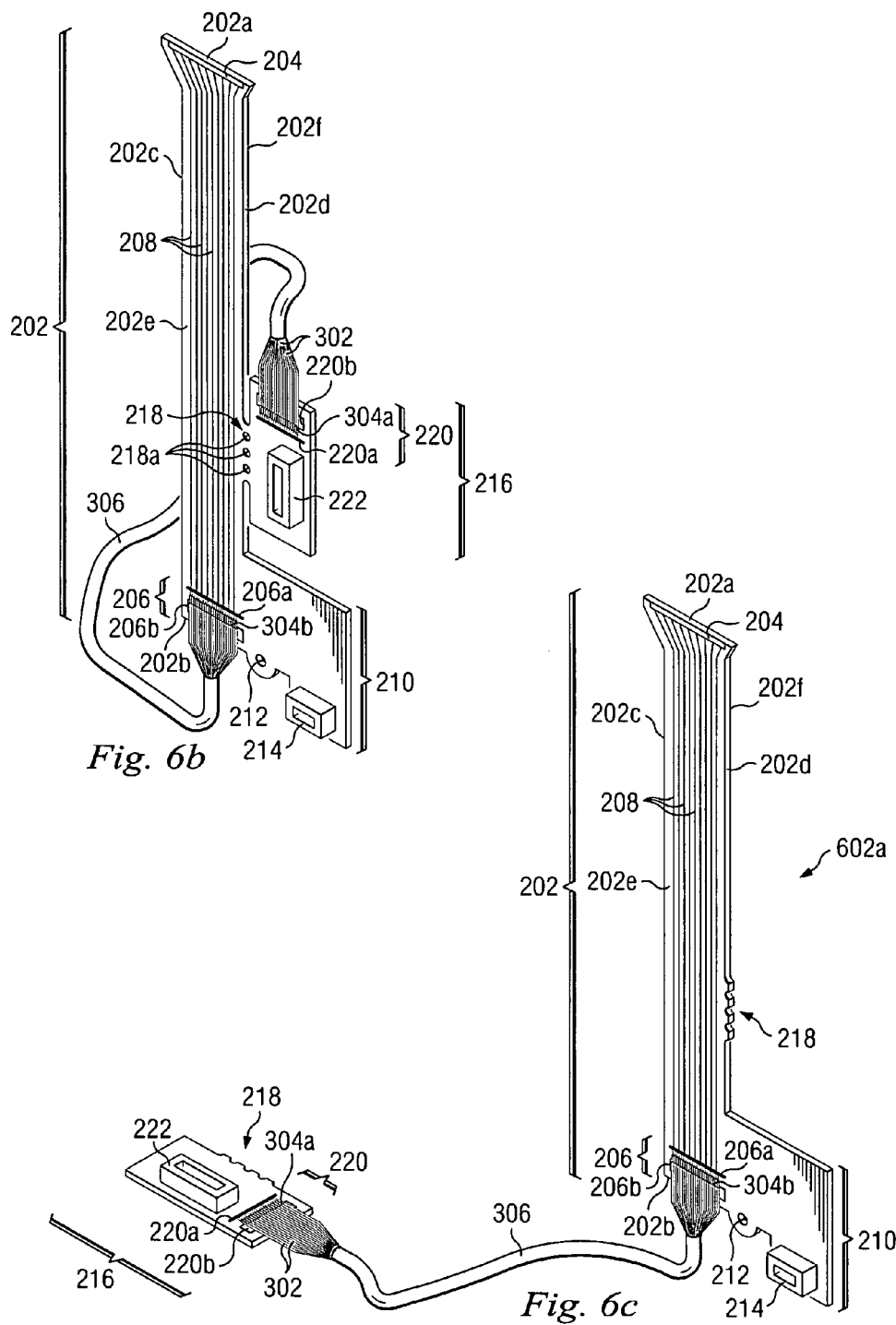
FIG. 6b is a perspective view illustrating an embodiment of the information handling system connecting cable of FIG. 3 coupled to the circuit board of FIG. 2.
FIG. 6c is a perspective view illustrating an embodiment of a display coupling apparatus including the information handling system connecting cable and the circuit board of FIG. 6b with a second circuit board separated from a first circuit board.
Figure 6F:
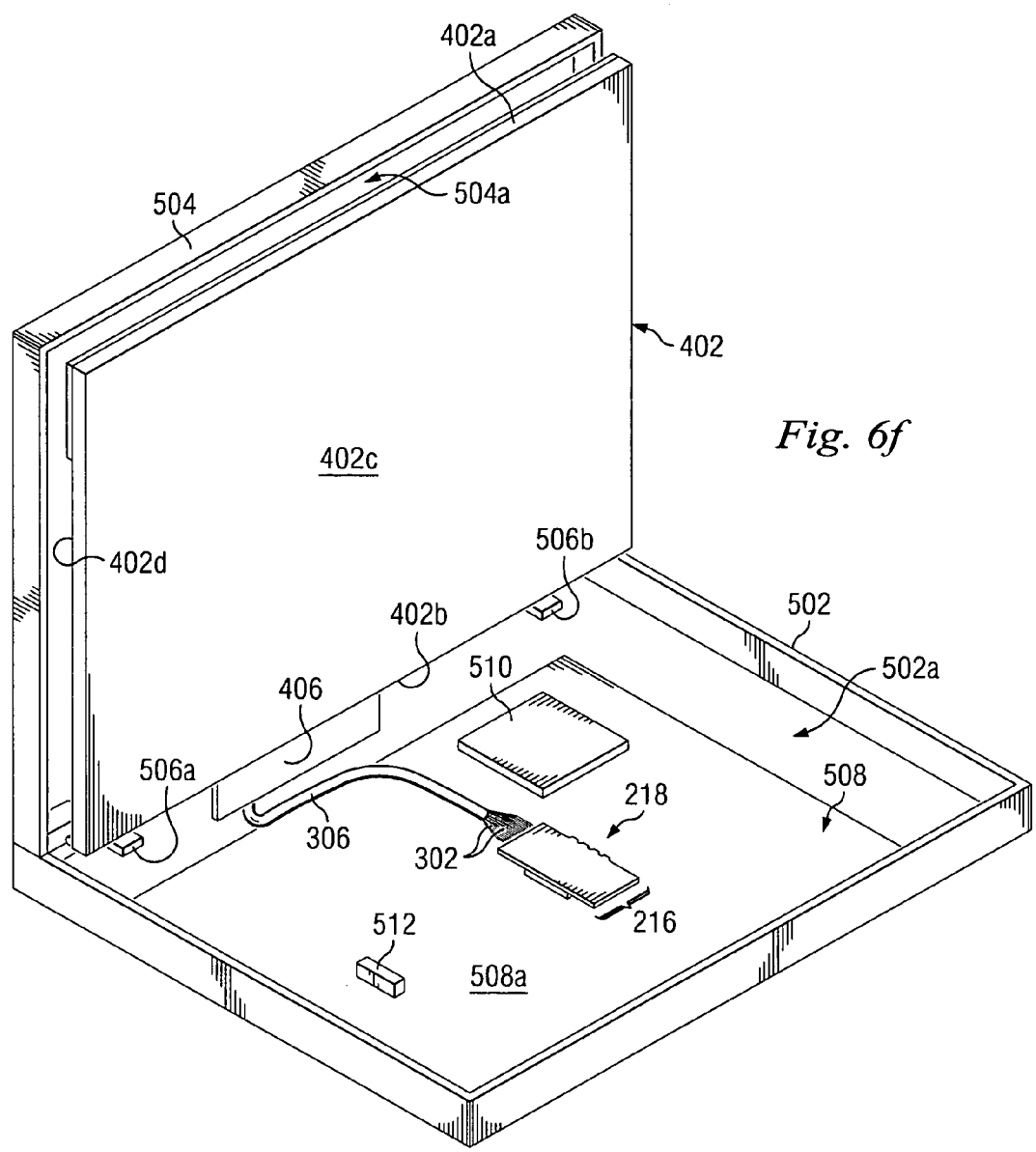
FIG. 6f is a perspective view illustrating an embodiment of the display coupling apparatus and the display of FIG. 6e being coupled to the chassis of FIG. 5.
Figure 6G:
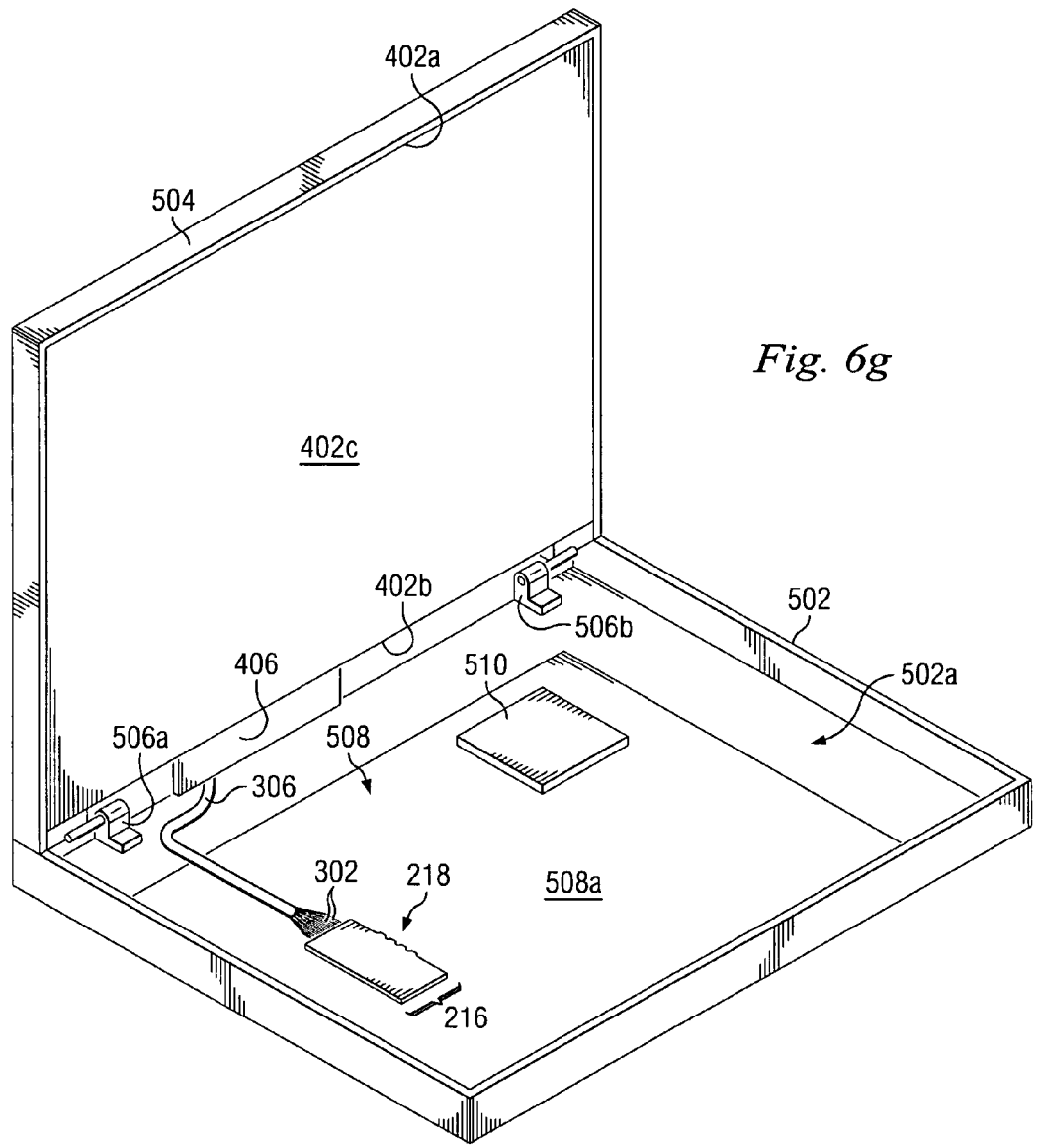
FIG. 6g is a perspective view illustrating an embodiment of the display coupling apparatus and the display of FIG. 6e coupled to the chassis of FIG. 5.

Referring now to FIGS. 2, 3a, 3b, 6a, 6b, and 6c, a method 600 for coupling a display to an information handling system is illustrated. The method 600 begins at step 602 where a display coupling apparatus is provided. The circuit board 200, illustrated in FIG. 2, is provided and the information handling system connecting cable 300 is coupled to the first circuit board 202 and the second circuit board 216. The end 304b of the information handling system connecting cable 300 is positioned on the first circuit board 202 such that the braided outer conductor 308a, illustrated in FIG. 3b, engages the ground pad 206b on the first cable coupling pad 206 and the center conductor 308b, illustrated in FIG. 3b, engages the conductor pad 206a on the first cable coupling pad 206. The end 304a of the information handling system connecting cable 300 is positioned on the second circuit board 216 such that the braided outer conductor 308a, illustrated in FIG. 3b, engages the ground pad 220b on the second cable coupling pad 220 and the center conductor 308b, illustrated in FIG. 3b, engages the conductor pad 220a on the second cable coupling pad 220. The ends 304b and 304a of the information handling system connection cable 300 may then be bulk soldered to the first cable coupling pad 206 and the second cable coupling pad 220, respectively, using methods known in the art such as, for example, hot bar soldering, in order to secure the braided outer conductor 308a to the ground pad 206b, the center conductor 308b to the conductor pad 206a, the braided outer conductor 308a to the ground pad 220b, and the center conductor 308b to the conductor pad 220a, as illustrated in FIG. 6b. The second circuit board 216 is then bent relative to the first circuit board 202 such that the break-away coupling 218 breaks and decouples the second circuit board 216 from the first circuit board 202, illustrated in FIG. 6c, providing a display coupling apparatus 602a.

Referring now to FIGS. 4, 6a, 6b, 6d, and 6e, the method 600 proceeds to step 604 where the display 400, illustrated in FIG. 4, is provided. The method 600 then proceeds to step 606 where the display coupling apparatus 602a is coupled to the display 400. The first circuit board 202 provides a handle for a user to utilize in coupling the display coupling apparatus 602a to the display 400, simplifying the coupling of the display coupling apparatus 602a to the display 400 relative to a conventional display coupling cable assembly. The display coupling apparatus 602a is positioned adjacent the display 400 such that the top surface 202e on the first circuit board 202 of the display coupling apparatus 602a is adjacent the rear surface 402d of the display 400 and the display connector end 204 is adjacent the display connector 404. The display connector end 204 is then inserted into the display connector 404, illustrated in FIG. 6d. The display coupling apparatus 602a is then moved until the top surface 202e of the first circuit board 202 is positioned immediately adjacent the rear surface 402d of the display 400 such that the inverter board connector 214 on the first circuit board 202 engages the inverter board connector 406a on the inverter board connecting section 406 of display 400, illustrated in FIG. 6e. With the display coupling apparatus 602a coupled to the display 400 as illustrated in FIG. 6e, the grounding aperture 212 defined by the first circuit board 202 is substantially aligned with the securing aperture 406b defined by the inverter board connecting section 406 such that a conventional fastener known in the art may be positioned in the grounding aperture 212 and the securing aperture 406b in order to secure the display coupling member 602a to the display 400 and ground the first circuit board 202. By positioning the fastener in the grounding aperture 212 and the securing aperture 406b, the first circuit board 220 is secured to the display 400 in 2 axes, reducing the failure rate relative to a conventional cable assembly for coupling a display to an information handling system due to factors such as, for example, disengagement of connectors.

Referring now to FIGS. 4, 5, 6a, 6c, 6e, 6f, and 6g, the method 600 proceeds to step 608 where the display coupling apparatus 602a is coupled to an information handling system. The display 400 with the display coupling apparatus 602a are positioned adjacent the chassis 500 such that rear surface 402d of the display 400 and the display coupling apparatus 602a are adjacent the display channel 504a while the inverter board connecting section 406 is adjacent the base section 502 of the chassis 500, illustrated in FIG. 6f. The display 400 is then moved into the display channel 504a and coupled to the display section 504 of the chassis 500 using methods known in the art, illustrated in FIG. 6g. The section of the cables 302 on the information handling system connecting cable 300 including the wrap 306 is run through the display channel 504a, adjacent the pivotal coupler 506a, and into the board housing 502a, illustrated in FIG. 6g. The information handling system connector 222 on second circuit board 216 is then engaged with the microprocessor coupler 512 on board 508, illustrated in FIG. 6g, electrically coupling the display 400 to the microprocessor 510 through the display coupling apparatus 602a. In an embodiment, the traces 208 on first circuit board 202 may be varied in width, pitch, and/or length in order to tune the signals sent between the microprocessor 510 and the display 400 and in order to reduce the voltage drop across the first circuit board 202.

Thus, a display coupling apparatus 602a is provided with a number of benefits over conventional display coupling cables assemblies known in the art, such as reduced failure rates, shorter assembly times, reduced labor times, and reduced material costs. For example, the display coupling apparatus 602*a* may be assembled using automation tools, reducing the assembly time and labor costs associated with the assembly of conventional display coupling cable assemblies. The display coupling apparatus 602*a* couples a display to an information handling system using shorter lengths of cable than conventional display coupling cable assemblies, reducing the voltage drop associated with the small gauge wires used with conventional display coupling cable assemblies. Furthermore, the first circuit board 202 allows the traces 208 to be varied in size and length in order to further reduce voltage drops across the display coupling apparatus 602*a*. In an embodiment, the display coupling apparatus 602*a* replaces low-volume high-cost connectors associated with conventional display coupling cable assemblies with low-cost commodity surface mount technology connectors and includes a display connector end 204 which may directly engage the display connector 404, reducing the cost of the display coupling apparatus 602*a* relative to a conventional cable assembly for coupling a display to an information handling system.

Referring now to FIGS. 3 and 7, in an alternative embodiment, a display coupling apparatus 700 is illustrated which is substantially similar in design and operation to the display coupling apparatus 602*a*, described above with reference to FIG. 6*c*, with the provision of a plurality of device coupling cables 702 and 704 each including a connector 702*a* and 704*a*, respectively, on its distal end. The device coupling cable 702 extends from the side edge 202*c* of the first circuit board 202, and the device coupling cable 704 extends from the coupling section 210 on the first circuit board 202. In an embodiment, the device coupling cables 702 and 704 may be coupled to the first circuit board 202 in the same manner as described above for the information handling system connector cable 300, and the connectors 702*a* and 704*a* may include circuit boards and may be coupled to the cables 702 and 704, respectively, in the same manner as described above for the information handling system connector 222 and the second circuit board 216.

Referring now to FIG. 8, in an embodiment, a display 800 is illustrated which is substantially similar in design and operation to the display 400, described above with reference to FIG. 4, with the provision of a device connector 802. The device connector 802 is located adjacent the display connector 404 on the rear surface 402*d* of the display 400. In an embodiment, the device connector 802 may be electrically coupled to a variety of devices known in the art such as, for example, a camera, an antenna, a speaker, and/or a light emitting device (LED).

Figure 9:
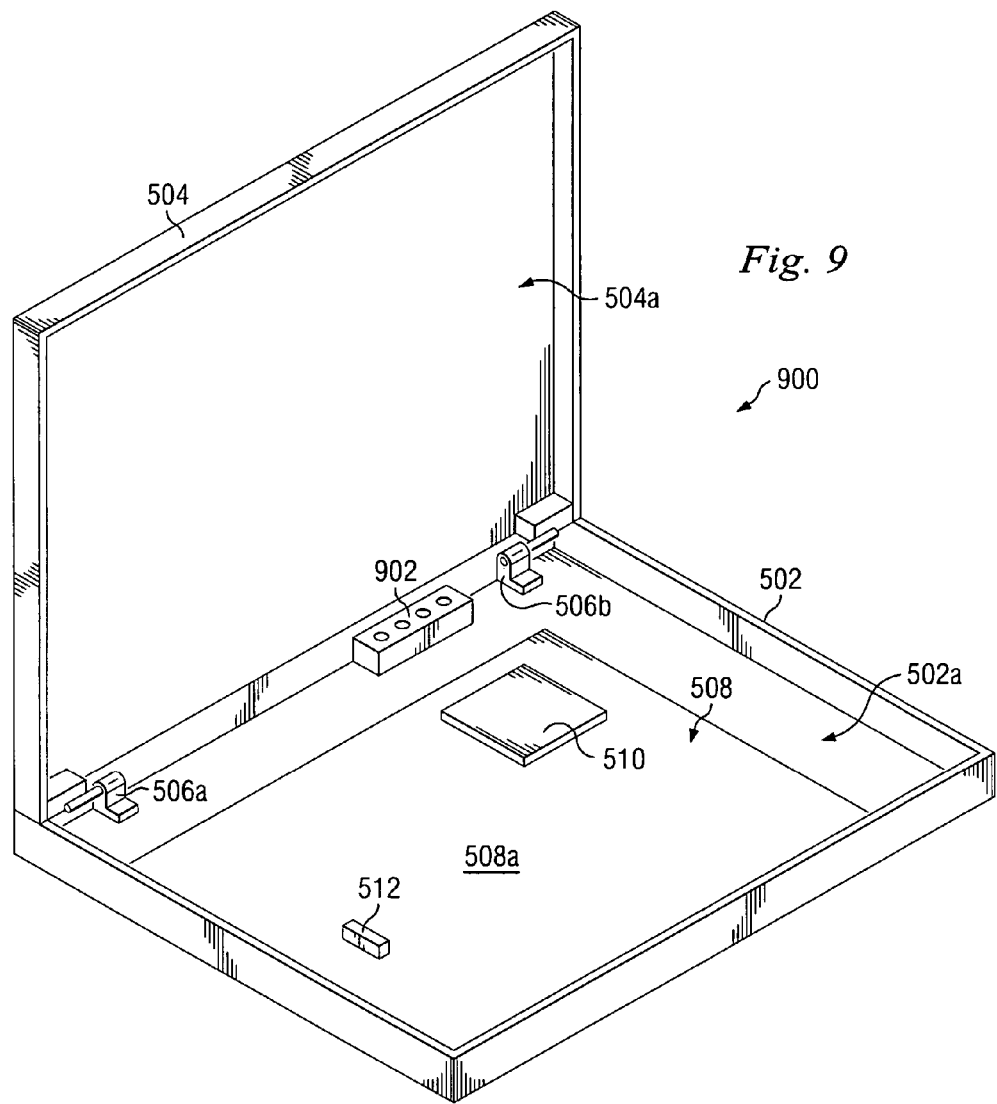
FIG. 9 is a perspective view illustrating an embodiment of a chassis used with the display coupling apparatus of FIG. 7 and the display of FIG. 8.
Figure 10B:
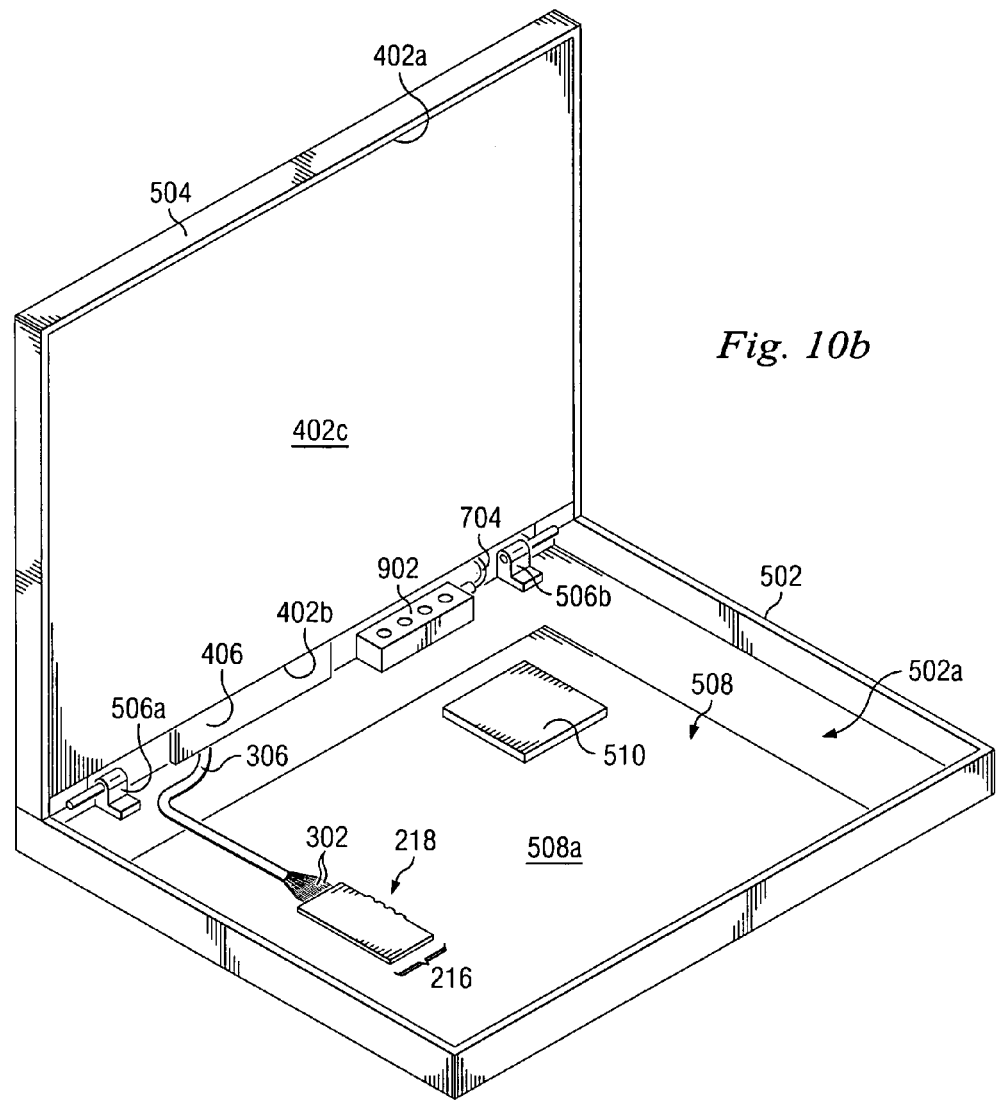
FIG. 10b is a perspective view illustrating an embodiment of the display coupling apparatus and the display of FIG. 10a coupled to the chassis of FIG. 9.

Referring now to FIG. 9, in an embodiment, a chassis 900 is illustrated which is substantially similar in design and operation to the chassis 500, described above with reference to FIG. 5, with the provision of a device 902. The device 902 is located in the board channel 502*a* on the base section 502 of the chassis 900 and adjacent the display section 504. In an embodiment, the device 902 may be a variety of devices known in the art such as, for example, a camera, an antenna, a speaker, and/or a light emitting device (LED).

Referring now to FIGS. 6*a*, 6*c*, 7, 8, 9, 10*a*, and 10*b*, in operation, the display coupling apparatus 700 is used in substantially the same manner as the display coupling apparatus 602*a* with the method 600, but with the provision of the display 800 replacing the display 400, the chassis 900 replacing the chassis 500, and with modified steps 606 and 608. At step 606 of the method 600, the connector 702*a* on device coupling cable 702 is engaged with the device connector 802 on display 800, illustrated in FIG. 10*a*. At step 608, the device coupling cable 704 is run through the display channel 504*a*, adjacent the pivotal coupler 506*b*, and the connector 704*a* is engaged with the device 902. Thus, the display coupling apparatus 700 allows the microprocessor 510 to be electrically coupled to devices included in the display 800 through the device coupling cable 702 and to devices included in the chassis 900 through the device coupling cable 704.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A display coupling apparatus, comprising:
 a first rigid circuit board comprising a display connector end that is located on a first edge of the first rigid circuit board and that is operable to be inserted in a first display connector on a display, a first cable coupling pad that is located on the first rigid circuit board, and a first surface mount technology (SMT) connector extending from the first rigid circuit board that is operable engage a second display connector coupled to the display while the display connector end is inserted in the first display connector, wherein at least one trace extends along the first rigid circuit board from the display connector end to the first cable coupling pad;
 a second rigid circuit board comprising a second cable coupling pad and a second SMT connector that is operable to engage a processor coupler while the display connector end is inserted in the first display connector and the first SMT connector engages the second display connector; and
 a connecting cable including at least one conductor that is insulted along its length except for a first end of the connecting cable where the at least one conductor is exposed and mounted to the first cable coupling pad and a second end of the connecting cable where the at least one conductor is exposed and mounted to the second cable coupling pad.

2. The apparatus of claim 1, wherein the first SMT connector comprises:
 an inverter board connector.

3. The apparatus of claim 1, wherein the first rigid circuit board defines a grounding aperture.

4. The apparatus of claim 1, wherein the first rigid circuit board comprises a first break-away edge and the second rigid circuit board comprises a second break-away edge that has been broken away from the first break-away edge.

5. The apparatus of claim 1, wherein the apparatus is operable to transmit an electrical signal from a processor through the processor coupler to the second SMT connector, then through the second SMT connector to the second cable coupling pad, then through the second cable coupling pad to the at least one conductor, then through the at least one conductor to the first cable coupling pad, then through the first cable coupling pad to the first SMT connector and the at least one trace, and then through the first SMT connector and the at least one trace to the display.

6. The apparatus of claim 1, wherein the at least one conductor comprises a plurality of conductors that have been ribbonized to insulate the plurality of conductors.

7. The apparatus of claim 6, wherein the first end of the connecting cable is bulk soldered to the first cable coupling pad.

8. The apparatus of claim 6, wherein the first end and the second end of the connecting cable comprise micro-coaxial cables.

9. The apparatus of claim 6, wherein the second end of the connecting cable is bulk soldered to the second cable coupling pad.

10. An information handling system (IHS), comprising:
a chassis comprising a processor coupler;
a processor located in the chassis and electrically coupled to the processor coupler;
a display coupled to the chassis and comprising a first display connector on the display and a second display connector coupled to the display; and
a display coupling apparatus coupling the display to the processor, the display apparatus comprising:
 a first rigid circuit board comprising a display connector end that is located on a first edge of the first rigid circuit board and that is inserted in the first display connector on the display, a first cable coupling pad that is located on the first rigid circuit board, and a first surface mount technology (SMT) connector extending from the first rigid circuit board and engaging the second display connector, wherein the first SMT connector extends from the first rigid circuit board such the first SMT connector is operable to engage and disengage the second display connector while the display connector end is inserted in the first display connector, and wherein at least one trace extends along the first rigid circuit board from the display connector end to the first cable coupling pad;
 a second rigid circuit board comprising a second cable coupling pad and a second SMT connector engaging a processor coupler, wherein the second SMT connector is operable to engage and disengage the processor coupler while the display connector end is inserted in the first display connector and the first SMT connector engages the second display connector; and
 an IHS connecting cable including at least one conductor that is insulated along its length except for a first end of the IHS connecting cable where the at least one conductor is exposed and mounted to the first cable coupling pad and a second end of the IHS connecting cable where the at least one conductor is coupled to the second cable coupling pad.

11. The system of claim 10, wherein the first SMT connector comprises
an inverter board connector that couples the first rigid circuit board to an inverter board on the display.

12. The system of claim 10, further comprising:
a grounding aperture defined by the first rigid circuit board, wherein the first rigid circuit board is secured to the chassis and grounded through the grounding aperture.

13. The system of claim 10, wherein the first rigid circuit board comprises first break-away edge and the second rigid circuit board comprises a second break-away edge that has been broken away from the first break-away edge.

14. The system of claim 10, wherein the apparatus is operable to transmit an electrical signal from a processor through the processor coupler to the at least one conductor, then through the at least one conductor to the first cable coupling pad, then through the first cable coupling pad to the first SMT connector and the at least one trace, and then through the first SMT connector and the at least one trace to the display.

15. The system of claim 10, wherein the at least one conductor comprises a plurality of conductors that have been ribbonized to insulate the plurality of conductors.

16. The system of claim 10, further comprising:
a second circuit board coupled to the IHS connecting cable, wherein the second end of the IHS connecting cable includes the at least one conductor exposed and mounted to a second cable coupling pad located on the second circuit board; and
an IHS connector located on the second circuit board and coupled to the processor coupler.

17. The system of claim 16, wherein the at least one conductor comprises a plurality of conductors that have been ribbonized to insulate the plurality of conductors, and wherein the first end of the IHS connecting cable is bulk soldered to the first cable coupling pad and the second end of the IHS connecting cable is bulk soldered to the second cable coupling pad.

18. A method for coupling a display to an information handling system (IHS), comprising:
providing a display comprising a display connector and an inverter connector;
coupling a display coupling apparatus to the display, wherein the display coupling apparatus comprises a first rigid circuit board including a display connector end that is located on a first edge of the first rigid circuit board and that engages the display connector on the display, a first cable coupling pad that is located on the first rigid circuit board, and a first surface mount technology (SMT) connector that extend from the first rigid circuit board and that engages the inverter connector, wherein the first SMT connector extends from the first rigid circuit board such the first SMT connector is operable to engage and disengage the inverter connector while the display connector end is inserted in the first display connector, and wherein at least one trace extends along the first rigid circuit board from the display connector end to the first cable coupling pad; and
coupling a second SMT connector that extends from a second rigid circuit board to a processor coupler on an IHS while the display connector end is inserted in the first display connector and the first SMT connector engages the second display connector, wherein an IHS connector cable is provided that includes at least one conductor that is insulated along its length except for the first end of the IHS connecting cable where the at least one conductor is coupled to the first cable coupling pad on the first rigid circuit board and a second end of the IHS connecting cable where the at least one conductor is coupled to the second cable coupling pad on the second rigid circuit board.

19. The method of claim 18, wherein the first rigid circuit board comprises first break-away edge and the second rigid circuit board comprises a second break-away edge that has been broken away from the first break-away edge.

20. The method of claim 18, further comprising:
securing the circuit board to the display, whereby the securing comprises grounding the display coupling apparatus.

21. The method of claim 18, further comprising:
transmitting an electrical signal from a processor through the processor coupler to the at least one conductor, then through the at least one conductor to the first cable coupling pad, then through the first cable coupling pad to the first SMT connector and the at least one trace, and then through the first SMT connector and the at least one trace to the display.

* * * * *